United States Patent
Karner et al.

(10) Patent No.: US 11,728,427 B2
(45) Date of Patent: Aug. 15, 2023

(54) POWER SEMICONDUCTOR DEVICE HAVING A STRAIN-INDUCING MATERIAL EMBEDDED IN AN ELECTRODE

(71) Applicant: Infineon Technologies Austria AG, Villach (AT)

(72) Inventors: Stefan Karner, Klagenfurt (AT); Oliver Blank, Villach (AT); Günter Denifl, Annenheim (AT); Germano Galasso, Unterhaching (DE); Saurabh Roy, Villach (AT); Hans-Joachim Schulze, Taufkirchen (DE); Michael Stadtmueller, Villach (AT)

(73) Assignee: Infineon Technologies Austria AG, Villach (AT)

( * ) Notice: Subject to any disclaimer, the term of this patent is extended or adjusted under 35 U.S.C. 154(b) by 136 days.

(21) Appl. No.: 17/353,119

(22) Filed: Jun. 21, 2021

(65) Prior Publication Data

US 2022/0406937 A1    Dec. 22, 2022

(51) Int. Cl.
*H01L 29/78* (2006.01)
*H01L 29/40* (2006.01)
*H01L 29/423* (2006.01)

(52) U.S. Cl.
CPC ........ *H01L 29/7845* (2013.01); *H01L 29/407* (2013.01); *H01L 29/4236* (2013.01); *H01L 29/7813* (2013.01); *H01L 29/7843* (2013.01)

(58) Field of Classification Search
CPC ............... H01L 29/7845; H01L 29/407; H01L 29/4236; H01L 29/7813; H01L 29/7843; H01L 29/7842

See application file for complete search history.

(56) References Cited

U.S. PATENT DOCUMENTS

2012/0313161 A1    12/2012   Grivna et al.
2013/0241004 A1     9/2013   Chen et al.

OTHER PUBLICATIONS

Hueting, Raymond J. E., et al., "On Device Architectures, Subthreshold Swing, and Power Consumption of the Piezoelectric Field-Effect Transistor", IEEE Journal of the Electron Devices Society, vol. 3, No. 3, Apr. 22, 2015, pp. 149-157.

*Primary Examiner* — Joseph C. Nicely
(74) *Attorney, Agent, or Firm* — Murphy, Bilak & Homiller, PLLC

(57) ABSTRACT

A semiconductor device is described. The semiconductor device includes: a semiconductor substrate; an electrode structure on or in the semiconductor substrate, the electrode structure including an electrode and an insulating material that separates the electrode from the semiconductor substrate; and a strain-inducing material embedded in the electrode. The electrode structure adjoins a region of the semiconductor substrate through which current flows in a first direction during operation of the semiconductor device. The electrode is under either tensile or compressive stress in the first direction. The strain-inducing material either enhances or at least partly counteracts the stress of the electrode in the first direction. Methods of producing the semiconductor device are also described.

30 Claims, 11 Drawing Sheets

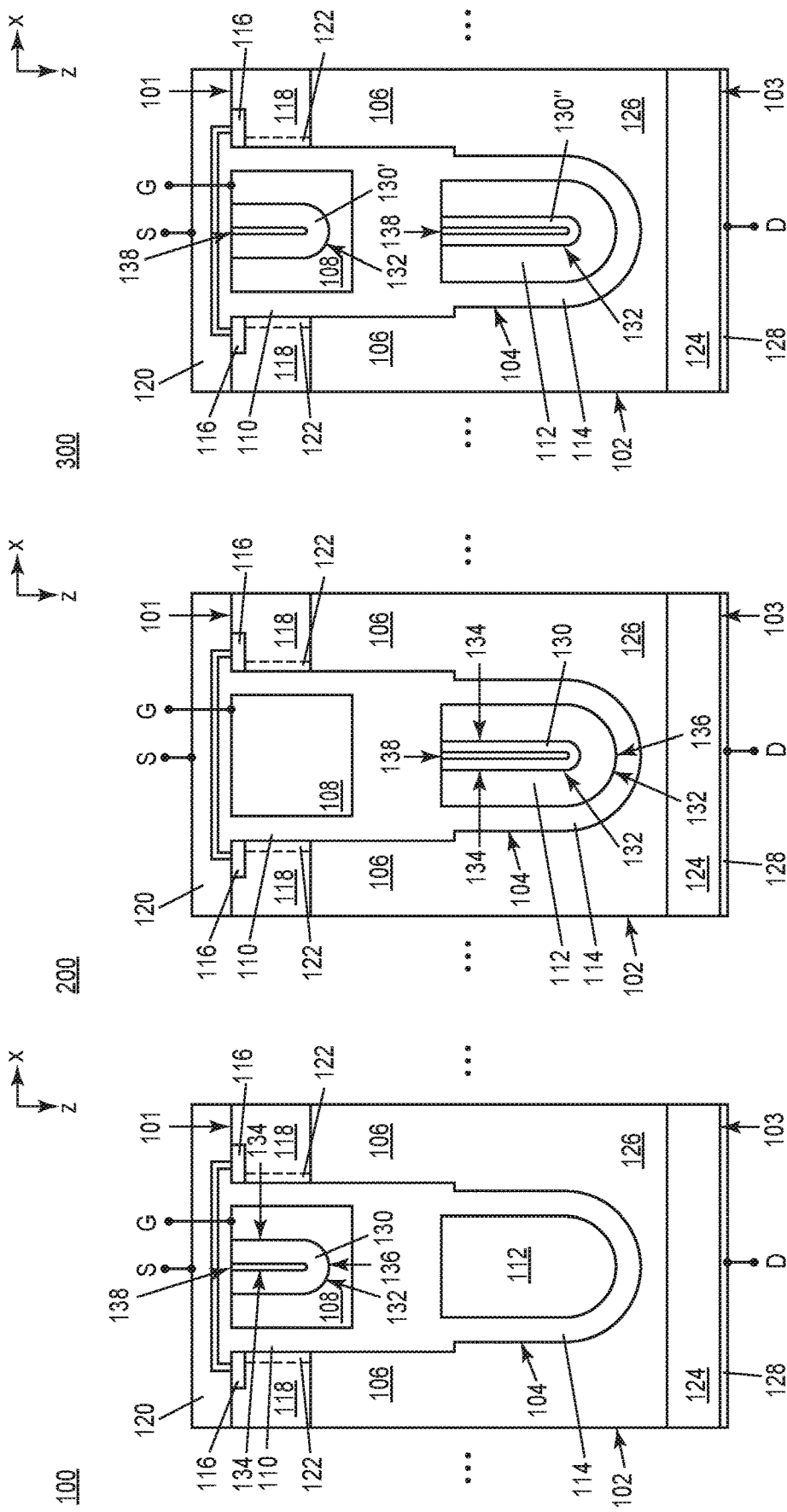

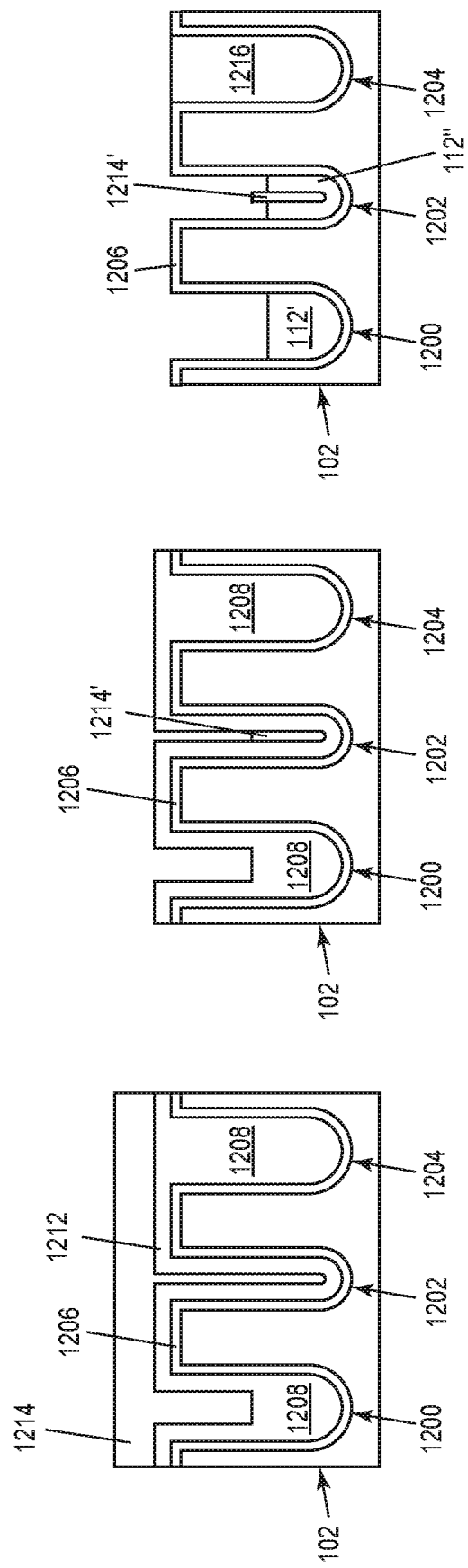

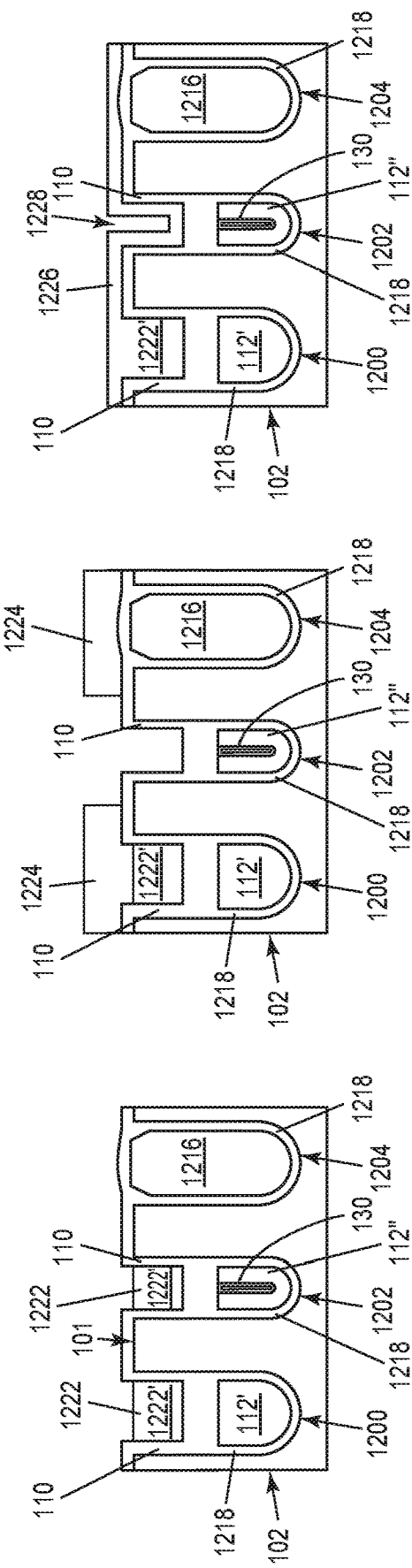

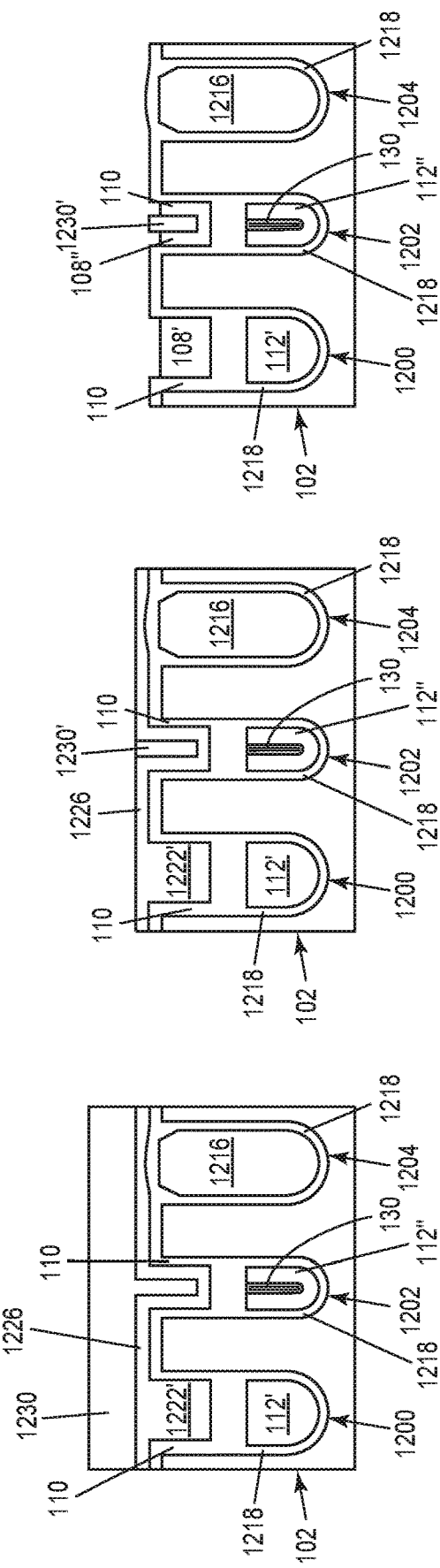

POWER SEMICONDUCTOR DEVICE HAVING A STRAIN-INDUCING MATERIAL EMBEDDED IN AN ELECTRODE

BACKGROUND

Performance enhancement for power semiconductor devices such as power MOSFETs (metal-oxide-semiconductor field-effect transistors), IGBTs (insulated gate bipolar transistors), HEMTs (high-electron mobility transistors), etc. is typically achieved by reducing the device dimensions. However, tooling, process and material constraints limit the amount by which device dimensions can be further reduced.

Thus, there is a need for new techniques for enhancing the performance of power semiconductor devices.

SUMMARY

According to an embodiment of a semiconductor device, the semiconductor device comprises: a semiconductor substrate; an electrode structure on or in the semiconductor substrate, the electrode structure comprising an electrode and an insulating material that separates the electrode from the semiconductor substrate; and a strain-inducing material embedded in the electrode, wherein the electrode structure adjoins a region of the semiconductor substrate through which current flows in a first direction during operation of the semiconductor device, wherein the electrode is under either tensile or compressive stress in the first direction, wherein the strain-inducing material either enhances or at least partly counteracts the stress of the electrode in the first direction.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1 through 11 illustrate respective partial cross-sectional views of semiconductor devices each having enhanced charge carrier mobility in one or more targeted regions by introducing strain, according to different embodiments.

FIGS. 12A through 12H illustrate partial cross-sectional views of an embodiment of embedding a strain-inducing material in a field plate electrode.

FIGS. 13A through 13H illustrate partial cross-sectional views of an embodiment of embedding a strain-inducing material in a gate electrode.

DETAILED DESCRIPTION

Figure 5:
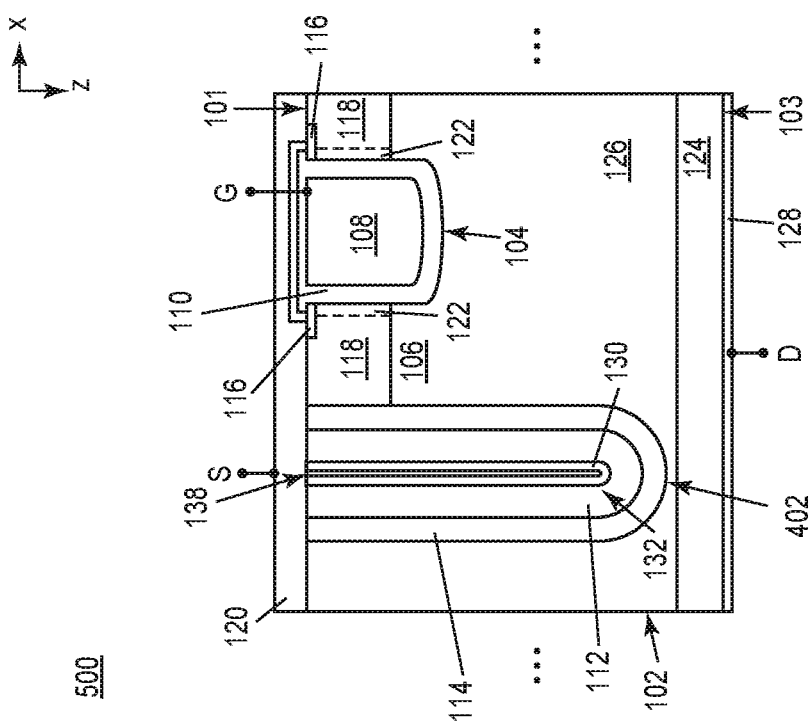

The embodiments described herein enhance charge carrier mobility in power semiconductor devices by embedding a strain-inducing material in an electrode of an electrode structure. The electrode structure adjoins a region of the power semiconductor device through which current flows in a current flow direction during operation of the device. For example, the electrode may be a planar or trench gate electrode used to control the current flow in a channel region of the device. In another example, the electrode may be a field plate electrode used to reduce area-dependent on-state resistance in a drain region of the device. In either case, the electrode with the embedded strain-inducing material is under either tensile or compressive stress in the first (current flow) direction. The strain-inducing material either enhances or at least partly counteracts the stress of the electrode in the current flow direction such that a mobility of charge carriers that contribute to the current flow is increased in the region of the semiconductor substrate that adjoins the electrode structure.

Described next with reference to the figures are embodiments of the improved contact structure and corresponding methods of production.

FIG. 1 illustrates a partial cross-sectional view of an embodiment of a semiconductor device 100 having enhanced charge carrier mobility in one or more targeted regions by introducing strain. The semiconductor device 100 may be a low voltage power MOSFET having a maximum voltage rating of 40V or below. The semiconductor device 100 instead may be a medium voltage power MOSFET having a maximum voltage rating between 40V and 100V. Other device types may utilize the contact teachings described herein, such as but not limited to IGBTs, HEMTs, etc.

The semiconductor device 100 includes a semiconductor substrate 102. The semiconductor device 100 is described in the context of Si (silicon) as the semiconductor material of the substrate 102. In general, the substrate 102 may comprise one or more semiconductor materials that are used to form semiconductor devices such as power MOSFETs, IGBTs, HEMTs, etc. For example, the substrate 102 may include Si, silicon carbide (SiC), germanium (Ge), silicon germanium (SiGe), gallium nitride (GaN), gallium arsenide (GaAs), and the like. The semiconductor substrate 102 may be a bulk semiconductor material or may include one or more epitaxial layers grown on a bulk semiconductor material.

The semiconductor device 100 further includes gate trenches 104 extending from a first main surface 101 of the semiconductor substrate 102 and into the substrate 102, and semiconductor mesas 106 between adjacent gate trenches 104. Only a single gate trench 104 is shown in FIG. 1. The gate trenches 104 may be 'stripe-shaped' in that the gate trenches 104 have a longest linear dimension in a direction that runs in and out of the page in FIG. 1 and transverse to the depth-wise direction (z direction in FIG. 1) of the semiconductor substrate 102.

Each gate trench 104 contains an electrode structure that includes a gate electrode 108 disposed in the gate trench 104 and a gate dielectric insulating material 110 that separates the gate electrode 108 from the surrounding semiconductor substrate 102. The gate electrodes 108 are electrically connected to a gate terminal (G) of the semiconductor device 100.

A field plate electrode 112 may be disposed in the gate trenches 104 below the gate electrodes 108 and insulated from the surrounding semiconductor substrate 102 and the gate electrodes 108 by a field dielectric insulating material 114. The field plates 112 instead may be disposed in different trenches (not shown) than the gate electrodes 108. For example, the field plates 112 may be disposed in needle-shaped trenches that are separate from the gate trenches 104. Needle-shaped trenches are trenches that are narrow and long in a depth-wise direction (z direction in FIG. 1) of the semiconductor substrate 102. Needle-shaped field plate trenches may resemble a needle, column or spicule in the depth-wise direction of the semiconductor substrate 102.

The gate electrodes 108 and the field plate electrodes 112 may be made from any suitable electrically conductive material such as but not limited to polysilicon, metal (e.g., tungsten), metal alloy, etc. The gate electrodes 108 and the field plate electrodes 112 may comprise the same or different electrically conductive material. The gate dielectric insulating material 110 and the field dielectric insulating material 114 and may comprise the same or different electrically insulative material, e.g., SiOx and may be formed by one or more common processes such as but not limited to thermal oxidation and/or deposition.

The semiconductor mesas 106 between adjacent gate trenches 104 may include a source region 116 of a first conductivity type and a body region 118 of a second conductivity type opposite the first conductivity type. The body region 118 may include a body contact region (not shown) of the second conductivity type and having a higher doping concentration than the body region 118, to provide an ohmic connection with a source metallization 120. The first conductivity is n-type and the second conductivity type is p-type for an n-channel device whereas the first conductivity is p-type and the second conductivity type is n-type for a p-channel device. For either n-channel or p-channel devices, the source region 116 and the body region 118 included in the same semiconductor mesa 106 may form part of a transistor cell, and the transistor cells may be electrically connected in parallel between source (S) and drain (D) terminals of the semiconductor device 100 to form a power transistor and as indicated by the dashed lines in FIG. 1.

The electrode structure that includes the gate electrode 108 adjoins a channel region 122 through which current flows in a first (current flow) direction during operation of the semiconductor device 100. In the case of a vertical power MOSFET as shown in FIG. 1, the current flow direction is in the z-direction between the first main surface 101 of the semiconductor substrate 102 and a second main surface 103 of the semiconductor substrate 102 opposite the first main surface 101. In this case, a drain region 124 of the first conductivity type is located at the second main surface 103 of the semiconductor substrate 102 and a drift region 126 of the first conductivity type is positioned between the drain region 124 and the body region 118. A metallization 128 at the second main surface 103 of the semiconductor substrate 102 forms the drain (D) terminal of the vertical power MOSFET. In the case of a lateral power transistor, the current flow direction is in the x-direction along the first main surface 101 of the semiconductor substrate 102 and the drain region 124 is positioned at the first main surface 101 and spaced apart from the source region 116 by the drift region 126 at the first main surface 101.

Regardless of the type of power transistor implemented by the transistor cells, and according to the embodiment illustrated in FIG. 1, the semiconductor device 100 further includes a strain-inducing material 130 embedded in the gate electrode 108. The gate electrode 108 is under either tensile or compressive stress in the current flow direction, which is the z-direction in FIG. 1. The strain-inducing material 130 either enhances or at least partly counteracts the stress of the gate electrode 108 in the current flow direction such that the mobility of charge carriers that contribute to the current flow in the current flow direction is increased in the channel region 122.

Due to the use of increasingly complex material stacks with different elastic and thermal properties to fabricate semiconductor devices, strain develops during processing and thermal cycling of the device. Strain may also build up due to geometrical constraints, due to material formation processes such as oxidation, silicidation, and crystallization, and due to lattice mismatch between two materials.

In all semiconductor materials, strain influences electron and hole mobility due to strain-induced changes in the conductivity effective mass and scattering rate of charge carriers. From an overly simplified perspective, tensile strain along the direction of current flow increases electron mobility and decreases hole mobility whereas compressive strain along the direction of current flow increases hole mobility and decreases electron mobility. In practice, the strain fields in a device are extremely complex, especially near the interface of silicon and oxide.

To enhance electron mobility in an n-channel power MOSFET, the strain-inducing material 130 is more compressive than the gate electrode 108 along the gate oxide interface in the current flow direction (z-direction in FIG. 1). Accordingly, strain in the adjacent channel region 112 becomes more tensile or less compressive and either of which advantageously increase electron mobility. In one embodiment, the gate electrode 108 may have a void 132, the strain-inducing material 130 may line sidewalls 134 and a bottom 136 of the void 132, and the strain-inducing material 130 may comprise silicon oxide. The void 132 may be filled completely with the silicon oxide. Alternatively, an inner region 138 of the void 132 spaced inward from the sidewalls 134 and the bottom 136 of the void 132 may be unfilled by the silicon oxide, e.g., as shown in FIG. 1.

For a p-channel power MOSFET, hole mobility enhancement is provided by the strain-inducing material 130 having tensile stress in the current flow direction (z-direction in FIG. 1). Accordingly, strain in the adjacent channel region 112 becomes more compressive or less tensile and either of which advantageously increase hole mobility. In one embodiment, the semiconductor device 100 is a p-channel device and the strain-inducing material 130 comprises a material selected from the group consisting of silicon nitride (e.g., $Si_3N_4$), titanium nitride (TiN), tungsten (W), and a silicide such as TiSi, CoSi, NiSi or combinations thereof.

In some cases, the gate electrode 108 may comprise polysilicon. After annealing, the crystallized polysilicon is under tensile stress in the current flow direction (z-direction in FIG. 1) and therefore introduces compressive strain into the surrounding semiconductor mesa 106 in the current flow direction. The compressive strain imparted by the gate electrode 108 limits the mobility of electrons in the adjacent semiconductor mesa 106, including in the channel region 122, which is undesirable for n-channel devices and desirable for p-channel devices.

For an n-channel device and by embedding a strain-inducing material 130 into the gate electrode 108 that is either under less tensile stress than the gate electrode 108 or under compressive stress in the current flow direction (z-direction in FIG. 1), the tensile stress of the gate electrode 108 is at least partly counteracted by the strain-inducing material 130 in the current flow direction. At least partly counteracting the tensile stress of the gate electrode 108 in this way increases the tensile strain in the adjacent semiconductor mesa 106 along the direction of current flow between the source terminal (S) and the drain terminal (D) of the device 100.

If instead the gate electrode 108 is under compressive stress and thereby introduces tensile strain into the surrounding semiconductor mesa 106 in the current flow direction (z-direction in FIG. 1), the strain-inducing material 130 may be under more compressive stress than the gate electrode 108 in the current flow direction. In both cases, electron mobility is enhanced in the vertical direction for an n-channel device, including in the channel region 122, which reduces the overall on-state resistance $R_{ON}$ without degrading the voltage blocking capability of the device 100.

For a p-channel device, the charge carriers that contribute to the current flow in the current flow direction (z-direction in FIG. 1) are holes. Accordingly, the strain-inducing material 130 either enhances or at least partly counteracts the stress of the gate electrode 108 in the current flow direction such that strain in the channel region 122 becomes more compressive or less tensile in the current flow direction. For example, if the gate electrode 108 is under compressive stress in the current flow direction, the strain-inducing material 130 is either under less compressive stress than the gate electrode 108 or under tensile stress in the current flow direction. If instead the gate electrode 108 is under tensile stress in the current flow direction, the strain-inducing material 130 is under more tensile stress than the gate electrode 108 in the current flow direction. In both cases, hole mobility is enhanced in the vertical direction for a p-channel device, including in the channel region 122, which advantageously reduces the overall on-state resistance $R_{ON}$ without degrading the voltage blocking capability of the device 100.

For n-channel devices in general, the electrode 108 in which the strain-inducing material 130 is embedded may be under tensile or compressive stress in the current flow direction (z-direction in FIG. 1). In the case of tensile stress, the strain-inducing material 130 is under less tensile stress than the electrode 108 or even under compressive stress. In the case of compressive stress, the strain-inducing material 130 is under more compressive stress than the electrode 108. For example, the electrode 108 may comprise n-type or p-type doped polysilicon, TiN, TiN/W stack, doped or undoped polysilicon with a silicide such as TiSi, CoSi, NiSi or combinations thereof, and the strain-inducing material 130 may comprise compressive $SiO_2$ formed by oxidation, TEOS (tetraethyl orthosilicate) deposition, LPCVD (low-pressure chemical vapor deposition), ALD (atomic layer deposition), radical oxidation, etc., AlN (piezoelectric material formed by ALD), AlScN (piezoelectric material formed by ALD), PZT (piezoelectric material), graphenic carbon (slightly compressive) such as sheets of graphene having an adequate distribution of sp3 and sp2 bonds where sp3 bonds enable good adhesion to adjoining layers and sp2 bonds give rise to metallicity, compressive $Si_3N_4$ formed by PECVD (plasma-enhanced CVD), etc.

For p-channel devices in general, the electrode 108 in which the strain-inducing material 130 is embedded may be under tensile or compressive stress in the current flow direction (z-direction in FIG. 1). In the case of compressive stress, the strain-inducing material 130 is under less compressive stress than the electrode 108 or even under tensile stress. In the case of tensile stress, the strain-inducing material 130 is under more tensile stress than the electrode 108. For example, the electrode 108 may comprise n-type or p-type doped polysilicon, TiN, TiN/S stack, doped or undoped polysilicon with a silicide such as TiSi, CoSi, NiSi or combinations thereof, and the strain-inducing material 130 may comprise tensile $Si_3N_4$ (most $Si_3N_4$ deposition methods yield tensile $Si_3N_4$), TiN formed by ALD or CVD, tungsten (W) formed by CVD, a silicide such as TiSi, CoSi, NiSi or combinations thereof.

FIG. 2 illustrates a partial cross-sectional view of another embodiment of a semiconductor device 200 having enhanced charge carrier mobility in one or more targeted regions by introducing strain. The embodiment illustrated in FIG. 2 is similar to the embodiment illustrated in FIG. 1. Different, however, the strain-inducing material 130 is embedded in the field plate electrode 112 instead of the gate electrode 108 of the transistor cells. Each field plate electrode 112 adjoins the drift region 126 of the device 200.

If the semiconductor device 200 is an n-channel device, the charge carriers that contribute to the current flow in the current flow direction (z-direction in FIG. 2) are electrons and the strain-inducing material 130 either enhances or at least partly counteracts the stress of the field plate electrode 112 in the current flow direction such that strain in the drift region 126 becomes more tensile or less compressive in the current flow direction. For example, if the field plate electrode 112 is under tensile stress in the current flow direction, the strain-inducing material 130 is either under less tensile stress than the field plate electrode 112 or under compressive stress in the current flow direction. Conversely, if the field plate electrode 112 is under compressive stress in the current flow direction, the strain-inducing material 130 is under more compressive stress than the field plate electrode 112 in the current flow direction. In both field electrode stress cases, electron mobility is enhanced in the drift region 126 in the current flow direction for an n-channel device by embedding the strain-inducing material 130 in the field plate electrode 112.

If the semiconductor device 200 is a p-channel device, the charge carriers that contribute to the current flow in the current flow direction (z-direction in FIG. 2) are holes and the strain-inducing material 130 either enhances or at least partly counteracts the stress of the field plate electrode 112 in the current flow direction such that strain in the drift region 126 becomes more compressive or less tensile in the current flow direction. For example, if the field plate electrode 112 is under compressive stress in the current flow direction, the strain-inducing material 130 is either under less compressive stress than the field plate electrode 112 or under tensile stress in the current flow direction. Conversely, if the field plate electrode 112 is under tensile stress in the current flow direction, the strain-inducing material 130 is under more tensile stress than the field plate electrode 112 in the current flow direction. In both field electrode stress cases, hole mobility is enhanced in the drift region 126 in the current flow direction for a p-channel device by embedding the strain-inducing material 130 in the field plate electrode 112.

FIG. 3 illustrates a partial cross-sectional view of another embodiment of a semiconductor device 300 having enhanced charge carrier mobility in one or more targeted regions by introducing strain. The embodiment illustrated in FIG. 3 represents a combination of the embodiments illustrated in FIGS. 1 and 2. That is, a first strain-inducing material 130' is embedded in the gate electrode 108 as in FIG. 1 and a second strain-inducing material 130" is embedded in the field plate electrode 112 as in FIG. 2. The gate electrode 108 is under either tensile or compressive stress in the current flow direction (z-direction in FIG. 3) and the first strain-inducing material 130' either enhances or at least partly counteracts the stress of the gate electrode 108 in the current flow direction. Similarly, the field plate electrode 112 also is under either tensile or compressive stress in the current flow direction and the second strain-inducing material 130" either enhances or at least partly counteracts the stress of the field plate electrode 112 in the current flow direction. The stress and material configurations described above with reference to FIGS. 1 and 2 for the electrodes and strain-inducing material for both n-channel and p-channel devices also apply to the embodiment illustrated in FIG. 3.

Figure 4:
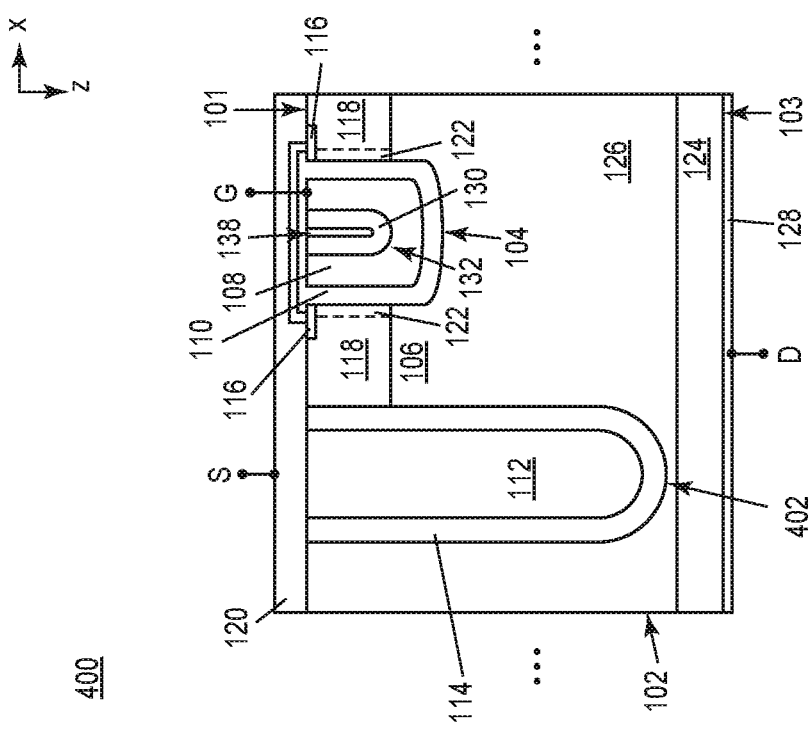

FIG. 4 illustrates a partial cross-sectional view of another embodiment of a semiconductor device 400 having enhanced charge carrier mobility in one or more targeted regions by introducing strain. The embodiment illustrated in FIG. 4 is similar to the embodiment illustrated in FIG. 1. Different, however, the field plate electrode 112 is disposed in a different trench 402 than the gate electrode 108. The field plate trenches 402 may extend deeper into the semiconductor substrate 102 than the gate trenches 104. The field plate trenches 402 may be needle-shaped or stripe-shaped (lines) whereas the gate trenches 104 may be stripe-shaped (lines) or shaped as a grid (array) that laterally surrounds the field plate trenches 402, for example. The stress and material configurations described above with reference to FIGS. 1 and 2 for the electrodes and strain-inducing material for both n-channel and p-channel devices also apply to the embodiment illustrated in FIG. 4.

FIG. 5 illustrates a partial cross-sectional view of another embodiment of a semiconductor device 500 having enhanced charge carrier mobility in one or more targeted regions by introducing strain. The embodiment illustrated in FIG. 5 is similar to the embodiment illustrated in FIG. 2. Different, however, the field plate electrode 112 is disposed in a different trench 402 than the gate electrode 108. The field plate trenches 402 may extend deeper into the semiconductor substrate 102 than the gate trenches 104. The field plate trenches 402 may be needle-shaped or stripe-shaped (lines) whereas the gate trenches 104 may be stripe-shaped or shaped as a grid that laterally surrounds the field plate trenches 402, for example. The stress and material configurations described above with reference to FIGS. 1 and 2 for the electrodes and strain-inducing material for both n-channel and p-channel devices also apply to the embodiment illustrated in FIG. 4.

Figure 6:
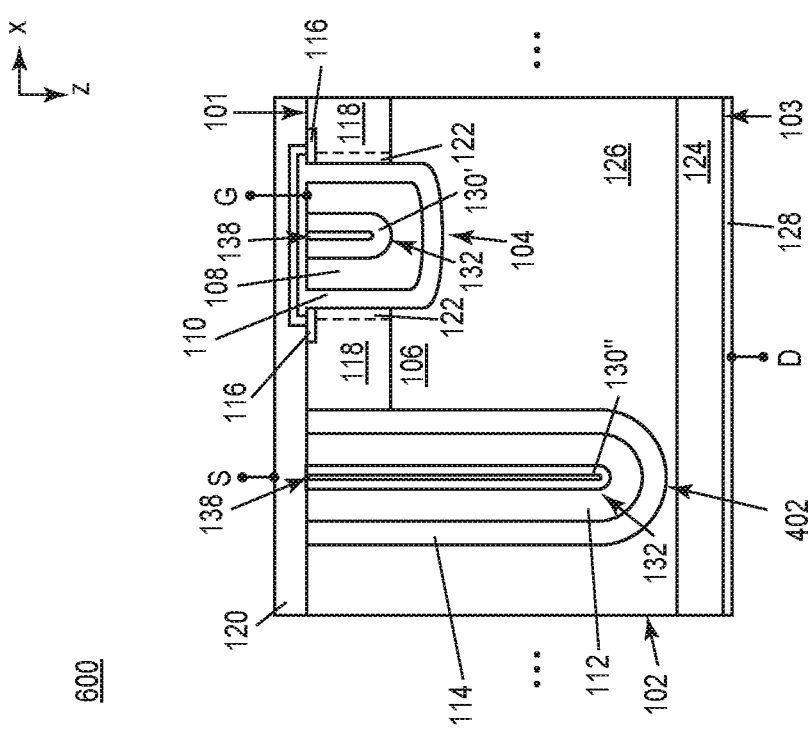

FIG. 6 illustrates a partial cross-sectional view of another embodiment of a semiconductor device 600 having enhanced charge carrier mobility in one or more targeted regions by introducing strain. The embodiment illustrated in FIG. 6 represents a combination of the embodiments illustrated in FIGS. 4 and 5. That is, the field plate electrodes 112 are disposed in different trenches 402 than the gate electrodes 108, a first strain-inducing material 130' is embedded in the gate electrodes 108 as in FIG. 4, and a second strain-inducing material 130" is embedded in the field plate electrodes 112 as in FIG. 5. The gate electrodes 108 are under either tensile or compressive stress in the current flow direction (z-direction in FIG. 6) and the first strain-inducing material 130' either enhances or at least partly counteracts the stress of the gate electrodes 108 in the current flow direction. Similarly, the field plate electrodes 112 also are under either tensile or compressive stress in the current flow direction and the second strain-inducing material 130" either enhances or at least partly counteracts the stress of the field plate electrodes 112 in the current flow direction. The stress and material configurations described above with reference to FIGS. 1 and 2 for the electrodes and strain-inducing material for both n-channel and p-channel devices also apply to the embodiment illustrated in FIG. 6.

Figure 7:
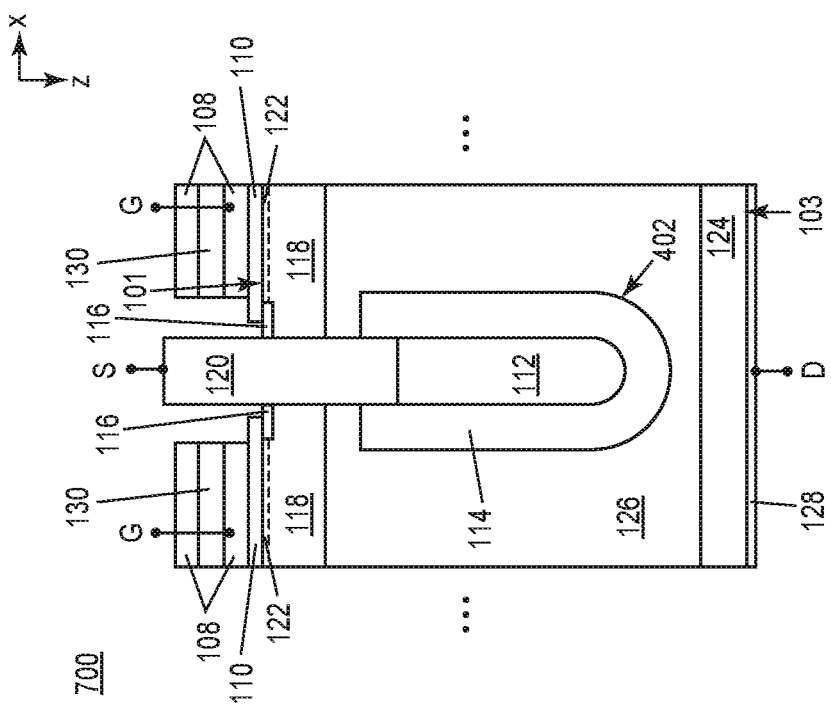

FIG. 7 illustrates a partial cross-sectional view of another embodiment of a semiconductor device 700 having enhanced charge carrier mobility in one or more targeted regions by introducing strain. According to this embodiment, the electrode structure is a planar gate electrode structure disposed on the first main surface 101 of the semiconductor substrate 102. The gate electrodes 108 are separated from the first main surface 101 of the semiconductor substrate 102 by the gate dielectric insulating material 110. The strain-inducing material 130 is embedded in the planar gate electrode 108. Although the semiconductor device 700 has a planar gate electrode structure, the device is still a vertical device in that the drain terminal D is disposed at the opposite side of the semiconductor substrate 102 as the source terminal S. The current flow path has a first (horizontal) part that traverses the channel region 122 along the horizontal gate structure in the x-direction in FIG. 2, and a second (vertical) part that traverses the drift region 126 in the z-direction to the drain terminal D. The planar gate electrode 108 is under either tensile or compressive stress in the horizontal part of the current flow path (x-direction in FIG. 2) and the strain-inducing material 130 either enhances or at least partly counteracts the stress of the planar gate electrode 108 in the horizontal part of the current flow path which occurs in the channel region 122. The stress and material configurations described above with reference to FIGS. 1 and 2 for the electrodes and strain-inducing material for both n-channel and p-channel devices also apply to the embodiment illustrated in FIG. 7.

The semiconductor device 700 illustrated in FIG. 7 also includes a trench 402 formed in the semiconductor substrate 102 and a field plate electrode 112 disposed in the trench 402 and separated from the semiconductor substrate 102 by a field dielectric insulating material 114. The field plate 112 may be at source potential, for example.

Figure 8:
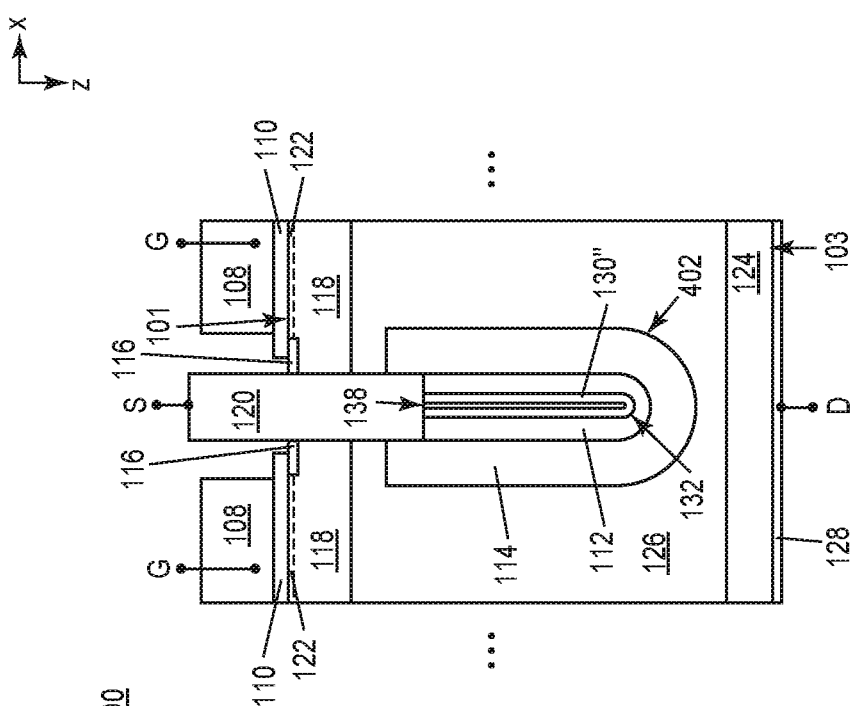

FIG. 8 illustrates a partial cross-sectional view of another embodiment of a semiconductor device 800 having enhanced charge carrier mobility in one or more targeted regions by introducing strain. The embodiment illustrated in FIG. 8 is similar to the embodiment illustrated in FIG. 7. Different, however, the strain-inducing material 130 is embedded in the field plate electrode 112 instead of the planar gate electrode 108 in FIG. 8. The field plate electrode 112 is under either tensile or compressive stress in the second (vertical) part of the current flow path (z-direction in FIG. 9) and the strain-inducing material 130 either enhances or at least partly counteracts the stress of the field plate electrode 112 in the vertical part of the current flow path. The stress and material configurations described above with reference to FIGS. 1 and 2 for the electrodes and strain-inducing material for both n-channel and p-channel devices also apply to the embodiment illustrated in FIG. 8.

Figure 9:
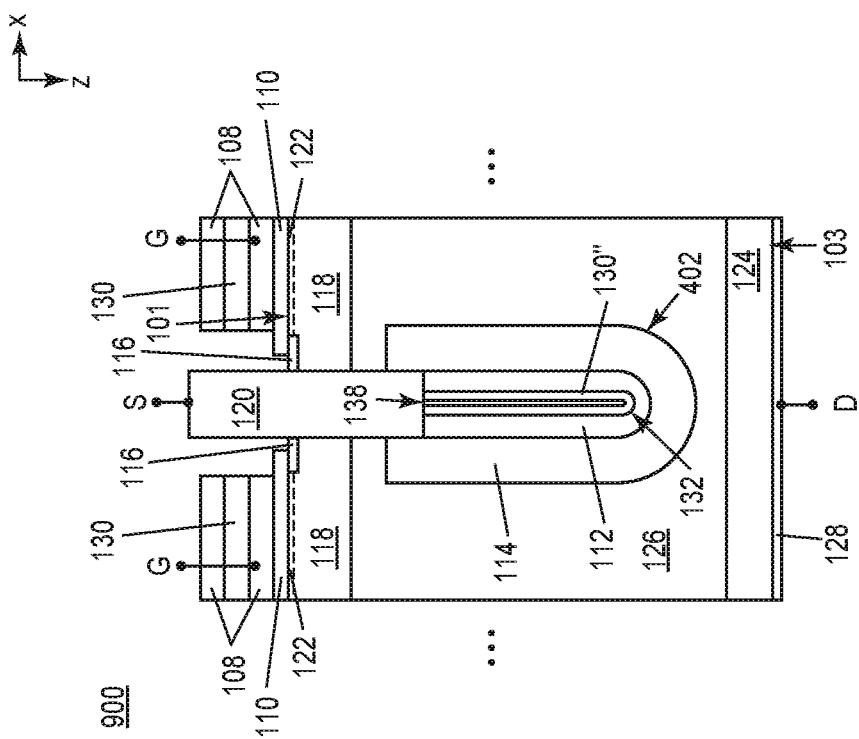

FIG. 9 illustrates a partial cross-sectional view of another embodiment of a semiconductor device 900 having enhanced charge carrier mobility in one or more targeted regions by introducing strain. The embodiment illustrated in FIG. 9 represents a combination of the embodiments illustrated in FIGS. 7 and 8. That is, a first strain-inducing material 130' is embedded in the planar gate electrode 108 as in FIG. 7 and a second strain-inducing material 130" is embedded in the field plate electrode 112 as in FIG. 8. The planar gate electrode 108 is under either tensile or compressive stress in the first (horizontal) part of the current flow path (x-direction in FIG. 9) and the first strain-inducing material 130' either enhances or at least partly counteracts the stress of the planar gate electrode 108 in the horizontal part current flow path. The field plate electrode 112 is under either tensile or compressive stress in the second (vertical) part of the current flow path (z-direction in FIG. 9) and the second strain-inducing material 130" either enhances or at least partly counteracts the stress of the field plate electrode 112 in the vertical part of the current flow path. The stress and material configurations described above with reference to FIGS. 1 and 2 for the electrodes and strain-inducing material for both n-channel and p-channel devices also apply to the embodiment illustrated in FIG. 3.

Figure 10:
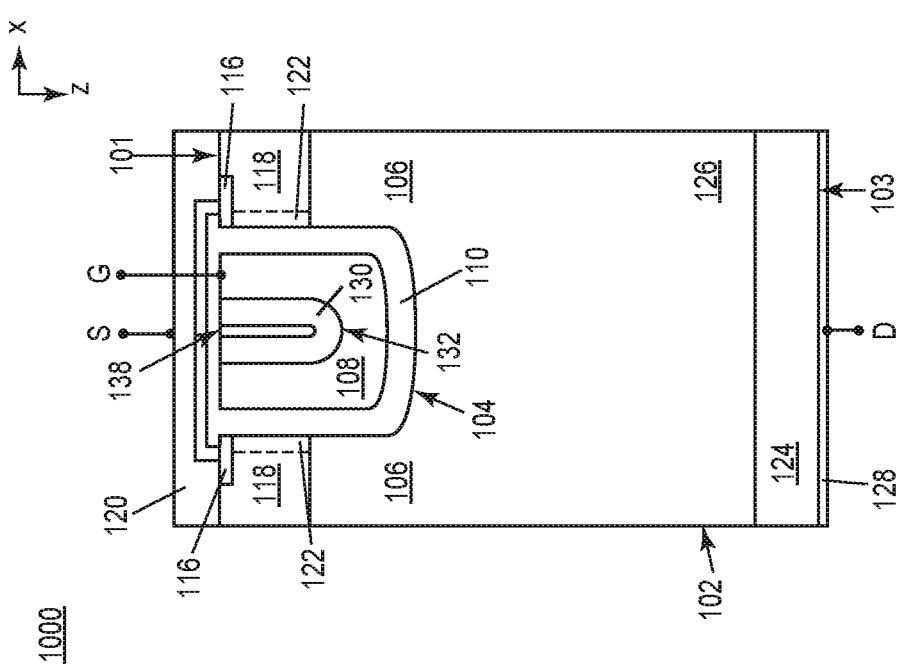

FIG. 10 illustrates a partial cross-sectional view of another embodiment of a semiconductor device 1000 having enhanced charge carrier mobility in one or more targeted regions by introducing strain. The embodiment illustrated in FIG. 10 is similar to the embodiment illustrated in FIG. 1. Different, however, the semiconductor device 1000 in FIG. 10 does not have field plate electrodes 112 buried in trenches formed in the semiconductor substrate 102. The stress and material configurations described above with reference to FIGS. 1 and 2 for the electrodes and strain-inducing material for both n-channel and p-channel devices also apply to the embodiment illustrated in FIG. 10.

Figure 11:
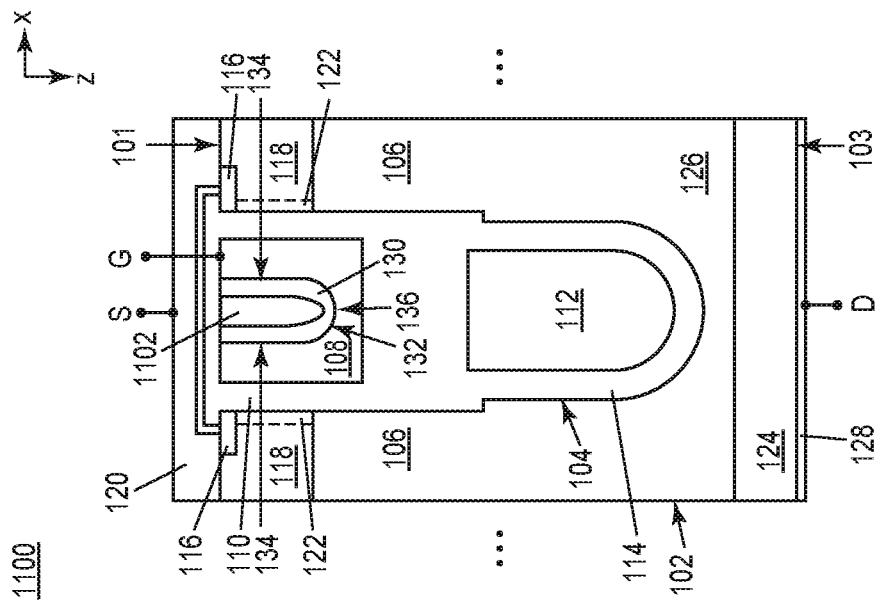

FIG. 11 illustrates a partial cross-sectional view of another embodiment of a semiconductor device 1100 having enhanced charge carrier mobility in one or more targeted regions by introducing strain. According to this embodiment, the strain-inducing material 130 comprises a piezoelectric material. An additional electrode 1102 may be embedded in the piezoelectric material, for controlling an electric field applied to the piezoelectric material.

The electrode 108 in which the strain-inducing material 130 is embedded and the additional electrode 1102 are configured to apply an electric field to the piezoelectric material to control the strain of the strain-inducing material 130. An inverse piezoelectric effect yields either a contraction or expansion of the piezoelectric material under the applied electric field. That is, in the case of a piezoelectric material as the strain-inducing material 130, the enhancing or counteracting stress provided by the strain-inducing material 130 is voltage-controlled. Accordingly, the strain effect may be activated only in the on-state of the semiconductor device 1100. In the case of PZT (lead zirconate titanate) as the piezoelectric material, PZT has a high piezoelectric response but is not compatible with Si technology. Accordingly, a seed layer may be required if PZT is used as the strain-inducing material 130. In the case of AlN as the piezoelectric material, AlN has about ten times lower piezoelectric response than PZT but is compatible with Si technology, can be deposited by ALD with reliable step coverage, and has a piezoelectric coefficient (pm/V) of 3.54+−0.60. In general, the piezoelectric-based strain-inducing material 130 may be embedded in either the gate electrode 108, the field plate electrode 112, or both the gate electrode 108 and the field plate electrode 112 where the gate electrode 108 may be trench-type or planar-type, as previously described herein with reference to FIGS. 1 through 10.

FIGS. 12A through 12H illustrate partial cross-sectional views of an embodiment of embedding the strain-inducing material 130 in a field plate electrode 112.

Figure 12C:
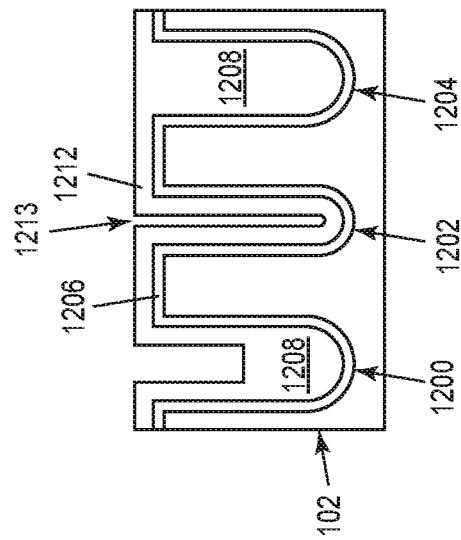
Figure 12B:
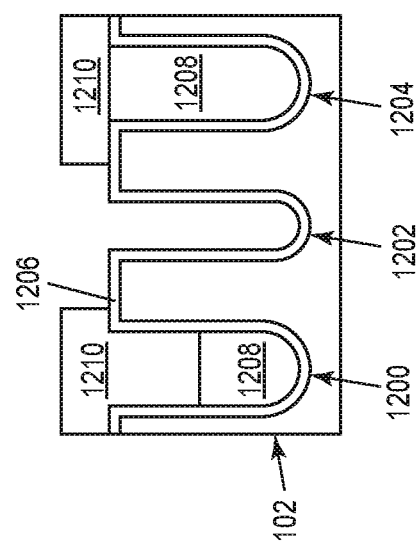
Figure 12A:
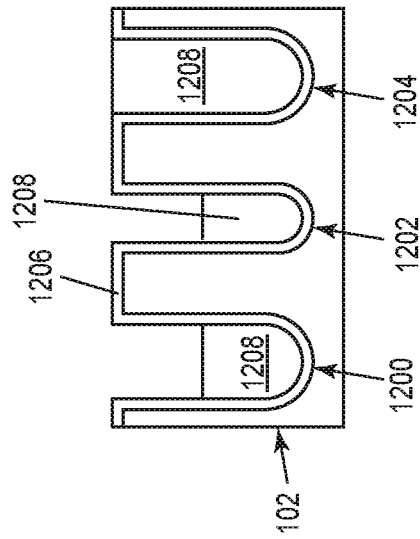

FIG. 12A shows a semiconductor substrate 102 after forming 3 different types of trenches 1200, 1202, 1204 in the semiconductor substrate 102, lining the trenches 1200, 1202, 1204 with a first insulating material 1206 such as SiO$_2$, then filling the trenches 1200, 1202, 1204 with a first electrically conductive material 1208 such as polysilicon, and recessing the first electrically conductive material 1208 including to a depth in the left and middle trenches 1200, 1202.

FIG. 12B shows the semiconductor substrate 102 after a first resist 1210 is deposited over the left and right trenches 1200, 1204 and the first electrically conductive material 1208 is removed from the exposed middle trench 1202.

FIG. 12C shows the semiconductor substrate 102 after the first resist 1210 is removed and a second electrically conductive material 1212 is deposited on the exposed sidewalls of the trenches 1200, 1202, 1204 and bottom of the middle trench 1202, followed by an annealing step. The second electrically conductive material 1212 is thin enough such that a space 1213 remains in the middle trench 1202.

FIG. 12D shows the semiconductor substrate 102 after a second resist 1214 is deposited over the trenches 1200, 1202, 1204. The second resist 1214 fills the space 1213 of the middle trench 1202.

FIG. 12E shows the semiconductor substrate 102 after the second resist 1214 is recessed, leaving a segment 1214' of the second resist 1214 in the lower part of the middle trench 1202.

FIG. 12F shows the semiconductor substrate 102 after isotropic etching of the second electrically conductive material 1212, leaving a first field plate electrode 112' in the lower part of the left trench 1200, a second field plate electrode 112" in the lower part of the middle trench 1202 and a source electrode 1216 in the right trench 1204. The source electrode 1216 in the right trench 1204 may form part of an edge termination structure or connection structure for the buried field plates 112', 112", for example.

Figure 12H:
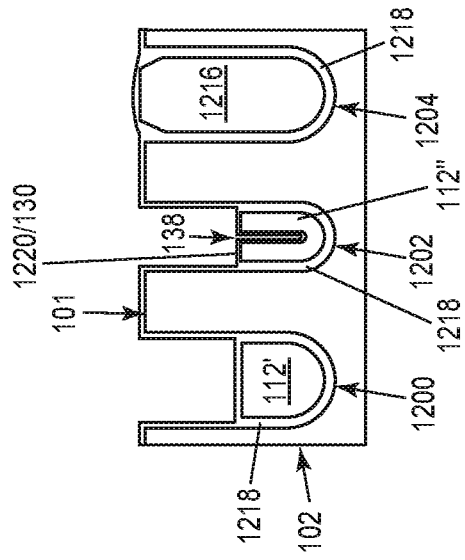
Figure 12G:
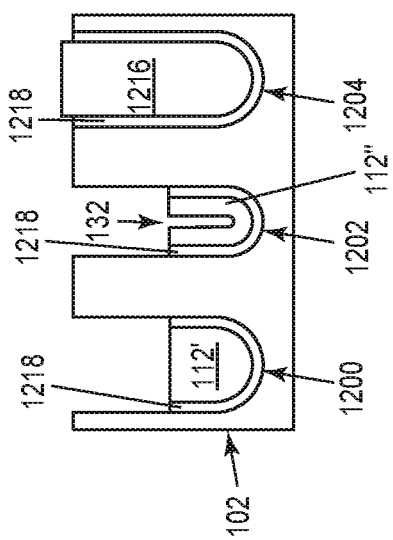

FIG. 12G shows the semiconductor substrate 102 after removal of the segment 1214' of the second resist 1214 previously disposed in the lower part of the middle trench 1202 and after etching of the exposed part of the first insulating material 1206. The part of the first insulating material 1206 that remains post-etching forms a field oxide 1218 in the trenches 1200, 1202, 1204 for separating the respective electrodes 112', 112", 1216 from the surrounding substrate 102. Removing the segment 1214' of the second resist 1214 from the lower part of the middle trench 1202 yields a void 132 within the second field plate electrode 112" in the middle trench 1202.

FIG. 12H shows the semiconductor substrate 102 after thermal oxidation of, or oxide deposition on, the electrodes 112', 112", 1216 and first main surface 101 of the semiconductor substrate 102. The oxidation process yields an oxide 1220 that lines the sidewalls and bottom of the void 132 within the second field plate electrode 112" in the middle trench 1202. The oxide 1220 forms the strain-inducing material 130 in this embodiment. In some cases, an inner region 138 of the void 132 may remain unfilled by the oxide 1220, e.g., as shown in FIG. 1.

FIGS. 13A through 13H illustrate partial cross-sectional views of an embodiment of embedding the strain-inducing material 130 in a gate electrode 108. The processing shown in FIGS. 13A through 13H continues from FIG. 12H.

FIG. 13A shows the semiconductor substrate 102 after a third electrically conductive material 1222 is deposited over the first main surface 101 of the substrate 102 and plasma etched, leaving a first residual structure 1222' in the upper part of the left trench 1202 and a second residual structure 1222" in the upper part of the middle trench 1202.

FIG. 13B shows the semiconductor substrate 102 after a third resist 1224 is deposited over the left and right trenches 1200, 1204 and the second residual structure 1222" in the upper part of the exposed middle trench 1202 is removed by etching.

FIG. 13C shows the semiconductor substrate 102 after the third resist 1224 is removed and a fourth electrically conductive material 1226 is deposited over the first main surface 101 of the semiconductor substrate 102, followed by an annealing step. The fourth electrically conductive material 1226 covers the exposed sidewalls of the middle trench 1202 but is thin enough such that a space 1228 remains in the upper part of the middle trench 1202.

FIG. 13D shows the semiconductor substrate 102 after a fourth resist 1230 is deposited over the first main surface 101 of the substrate 102. The fourth resist 1230 fills the space 1228 in the upper part of the middle trench 1202.

FIG. 13E shows the semiconductor substrate 102 after the fourth resist 1230 is recessed or planarized. A residual part 1230' of the fourth resist 1230 remains in the space 1228 in the upper part of the middle trench 1202 after the recessing/planarizing.

FIG. 13F shows the semiconductor substrate 102 after isotropic etching of the fourth electrically conductive material 1226, leaving a first gate electrode 108' in the upper part of the left trench 1200 and a second gate electrode 108" in the upper part of the middle trench 1202.

Figure 13G:
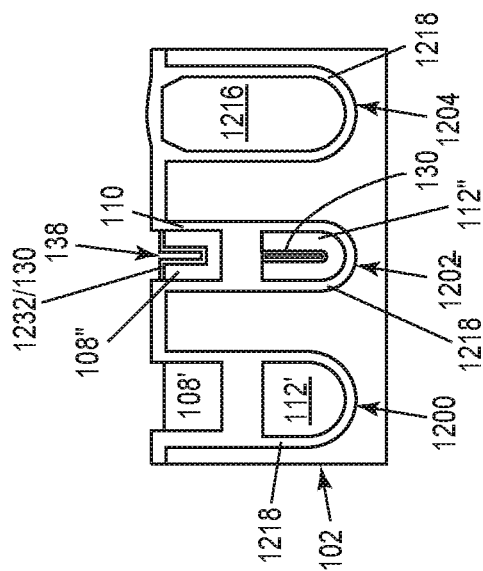

FIG. 13G shows the semiconductor substrate 102 after removal of the residual part 1230' of the fourth resist 1230 from the space 1228 in the upper part of the middle trench 1202 and after thermal oxidation of, or oxide deposition on, the gate electrodes 108', 108" and the first main surface 101 of the semiconductor substrate 102. The oxidation process yields an oxide 1232 that lines the sidewalls and bottom of the void within the second gate electrode 108" formed by removing the residual part 1230' of the fourth resist 1230 from the space 1228 in the upper part of the middle trench 1202. The oxide 1232 forms the strain-inducing material 130 in this embodiment. In some cases, an inner region 138 of the void may remain unfilled by the oxide 1232, e.g., as shown in FIG. 1.

Figure 13H:
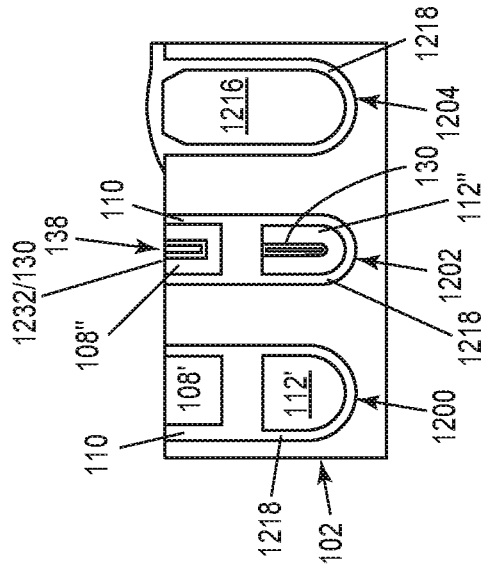

FIG. 13H shows the semiconductor substrate 102 after a plasma etch process that removes the oxide 1232 from the first main surface 101 of the substrate 102.

Although the present disclosure is not so limited, the following numbered examples demonstrate one or more aspects of the disclosure.

Example 1. A semiconductor device, comprising: a semiconductor substrate; an electrode structure on or in the semiconductor substrate, the electrode structure comprising an electrode and an insulating material that separates the electrode from the semiconductor substrate; and a strain-inducing material embedded in the electrode, wherein the electrode structure adjoins a region of the semiconductor substrate through which current flows in a first direction during operation of the semiconductor device, wherein the electrode is under either tensile or compressive stress in the first direction, wherein the strain-inducing material either enhances or at least partly counteracts the stress of the electrode in the first direction.

Example 2. The semiconductor device of example 1, wherein the electrode is a gate electrode, and wherein the region of the semiconductor substrate that adjoins the electrode structure is a channel region.

Example 3. The semiconductor device of example 2, wherein the semiconductor device is an n-channel device, wherein the charge carriers that contribute to the current flow in the first direction are electrons, and wherein the strain-inducing material either enhances or at least partly counteracts the stress of the gate electrode in the first direction such that strain in the channel region becomes more tensile or less compressive in the first direction.

Example 4. The semiconductor device of example 3, wherein the gate electrode is under tensile stress in the first direction, and wherein the strain-inducing material is either under less tensile stress than the gate electrode or under compressive stress in the first direction.

Example 5. The semiconductor device of example 3, wherein the gate electrode is under compressive stress in the first direction, and wherein the strain-inducing material is under more compressive stress than the gate electrode in the first direction.

Example 6. The semiconductor device of example 2, wherein the semiconductor device is a p-channel device, wherein the charge carriers that contribute to the current flow in the first direction are holes, and wherein the strain-inducing material either enhances or at least partly counteracts the stress of the gate electrode in the first direction such that strain in the channel region becomes more compressive or less tensile in the first direction.

Example 7. The semiconductor device of example 6, wherein the gate electrode is under compressive stress in the first direction, and wherein the strain-inducing material is either under less compressive stress than the gate electrode or under tensile stress in the first direction.

Example 8. The semiconductor device of example 6, wherein the gate electrode is under tensile stress in the first direction, and wherein the strain-inducing material is under more tensile stress than the gate electrode in the first direction.

Example 9. The semiconductor device of any of examples 2 through 8, wherein the gate electrode is disposed in a trench formed in the semiconductor substrate, and wherein the trench further includes a field plate electrode disposed below the gate electrode and insulated from the gate electrode.

Example 10. The semiconductor device of example 9, further comprising: an additional strain-inducing material embedded in the field plate electrode, wherein the field plate electrode adjoins a drift region of the semiconductor substrate, wherein the field plate electrode is under either tensile or compressive stress in the first direction, wherein the additional strain-inducing material either enhances or at least partly counteracts the stress of the field plate electrode in the first direction.

Example 11. The semiconductor device of any of examples 2 through 8, wherein the gate electrode is disposed in a first trench formed in the semiconductor substrate, wherein a field plate electrode is disposed in a second trench formed in the semiconductor substrate, and wherein the first trench and the second trench are laterally spaced apart from one another.

Example 12. The semiconductor device of example 11, further comprising: an additional strain-inducing material embedded in the field plate electrode, wherein the field plate electrode adjoins a drift region of the semiconductor substrate, wherein the field plate electrode is under either tensile or compressive stress in the first direction, wherein the additional strain-inducing material either enhances or at least partly counteracts the stress of the field plate electrode in the first direction.

Example 13. The semiconductor device of any of examples 1 through 8, wherein the electrode structure is a planar gate electrode structure disposed on a first main surface of the semiconductor substrate, wherein the electrode is a gate electrode, and wherein the insulating material separates the gate electrode from the first main surface of the semiconductor substrate.

Example 14. The semiconductor device of example 13, further comprising: a trench formed in the semiconductor substrate; a field plate electrode in the trench and separated from the semiconductor substrate by an additional insulating material.

Example 15. The semiconductor device of example 14, further comprising: an additional strain-inducing material embedded in the field plate electrode, wherein the field plate electrode is under either tensile or compressive stress in the first direction, wherein the additional strain-inducing material either enhances or at least partly counteracts the stress of the field plate electrode in the first direction.

Example 16. The semiconductor device of example 1, wherein the electrode is a field plate electrode, wherein the field plate electrode is disposed in a trench formed in the semiconductor substrate, and wherein the region of the semiconductor substrate that adjoins the electrode structure is a drift region.

Example 17. The semiconductor device of example 16, wherein the semiconductor device is an n-channel device, wherein the charge carriers that contribute to the current flow in the first direction are electrons, and wherein the strain-inducing material either enhances or at least partly counteracts the stress of the field plate electrode in the first direction such that strain in the drift region becomes more tensile or less compressive in the first direction.

Example 18. The semiconductor device of example 17, wherein the field plate electrode is under tensile stress in the first direction, and wherein the strain-inducing material is either under less tensile stress than the field plate electrode or under compressive stress in the first direction.

Example 19. The semiconductor device of example 17, wherein the field plate electrode is under compressive stress in the first direction, and wherein the strain-inducing material is under more compressive stress than the field plate electrode in the first direction.

Example 20. The semiconductor device of example 16, wherein the semiconductor device is a p-channel device, wherein the charge carriers that contribute to the current flow in the first direction are holes, and wherein the strain-inducing material either enhances or at least partly counteracts the stress of the field plate electrode in the first direction such that strain in the drift region becomes more compressive or less tensile in the first direction.

Example 21. The semiconductor device of example 20, wherein the field plate electrode is under compressive stress in the first direction, and wherein the strain-inducing material is either under less compressive stress than the field plate electrode or under tensile stress in the first direction.

Example 22. The semiconductor device of example 21, wherein the field plate electrode is under tensile stress in the first direction, and wherein the strain-inducing material is under more tensile stress than the field plate electrode in the first direction.

Example 23. The semiconductor device of any of examples 16 through 22, wherein the trench further includes a gate electrode disposed above the field plate electrode and insulated from the field plate electrode.

Example 24. The semiconductor device of any of examples 16 through 22, wherein a gate electrode is disposed in an additional trench formed in the semiconductor substrate, and wherein the trench and the additional trench are laterally spaced apart from one another.

Example 25. The semiconductor device of any of examples 1 through 5, 9 through 19 and 23 through 24, wherein the semiconductor device is an n-channel device, and wherein the strain-inducing material comprises a material selected from the group consisting of silicon oxide, silicon nitride, a piezoelectric material, and graphenic carbon.

Example 26. The semiconductor device of any of examples 1 through 25, wherein the electrode has a void, wherein the strain-inducing material lines sidewalls and a bottom of the void, and wherein the strain-inducing material comprises silicon oxide.

Example 27. The semiconductor device of example 26, wherein the void in the electrode is filled completely with the silicon oxide.

Example 28. The semiconductor device of example 27, wherein an inner region of the void spaced inward from the sidewalls and the bottom of the void is unfilled by the silicon oxide.

Example 29. The semiconductor device of any of examples 1 through 2, 6 through 16 and 20 through 24, wherein the semiconductor device is a p-channel device, and wherein the strain-inducing material comprises a material selected from the group consisting of silicon nitride, titanium nitride, tungsten, and a silicide.

Example 30. The semiconductor device of any of examples 1 through 29, wherein the strain-inducing material comprises a piezoelectric material, wherein the electrode structure comprises an additional electrode embedded in the piezoelectric material, and wherein the electrode and the additional electrode are configured to apply an electric field to the piezoelectric material to control the strain of the strain-inducing material.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A semiconductor device, comprising:
a semiconductor substrate;
an electrode structure on or in the semiconductor substrate, the electrode structure comprising an electrode and an insulating material that separates the electrode from the semiconductor substrate; and
a strain-inducing material embedded in the electrode,
wherein the electrode structure adjoins a region of the semiconductor substrate through which current flows in a first direction during operation of the semiconductor device,
wherein the electrode is under either tensile or compressive stress in the first direction,
wherein the strain-inducing material either enhances or at least partly counteracts the stress of the electrode in the first direction.
2. The semiconductor device of claim 1, wherein the electrode is a gate electrode, and wherein the region of the semiconductor substrate that adjoins the electrode structure is a channel region.

3. The semiconductor device of claim 2, wherein the semiconductor device is an n-channel device, wherein the charge carriers that contribute to the current flow in the first direction are electrons, and wherein the strain-inducing material either enhances or at least partly counteracts the stress of the gate electrode in the first direction such that strain in the channel region becomes more tensile or less compressive in the first direction.

4. The semiconductor device of claim 3, wherein the gate electrode is under tensile stress in the first direction, and wherein the strain-inducing material is either under less tensile stress than the gate electrode or under compressive stress in the first direction.

5. The semiconductor device of claim 3, wherein the gate electrode is under compressive stress in the first direction, and wherein the strain-inducing material is under more compressive stress than the gate electrode in the first direction.

6. The semiconductor device of claim 2, wherein the semiconductor device is a p-channel device, wherein the charge carriers that contribute to the current flow in the first direction are holes, and wherein the strain-inducing material either enhances or at least partly counteracts the stress of the gate electrode in the first direction such that strain in the channel region becomes more compressive or less tensile in the first direction.

7. The semiconductor device of claim 6, wherein the gate electrode is under compressive stress in the first direction, and wherein the strain-inducing material is either under less compressive stress than the gate electrode or under tensile stress in the first direction.

8. The semiconductor device of claim 6, wherein the gate electrode is under tensile stress in the first direction, and wherein the strain-inducing material is under more tensile stress than the gate electrode in the first direction.

9. The semiconductor device of claim 2, wherein the gate electrode is disposed in a trench formed in the semiconductor substrate, and wherein the trench further includes a field plate electrode disposed below the gate electrode and insulated from the gate electrode.

10. The semiconductor device of claim 9, further comprising:
an additional strain-inducing material embedded in the field plate electrode,
wherein the field plate electrode adjoins a drift region of the semiconductor substrate,
wherein the field plate electrode is under either tensile or compressive stress in the first direction,
wherein the additional strain-inducing material either enhances or at least partly counteracts the stress of the field plate electrode in the first direction.

11. The semiconductor device of claim 2, wherein the gate electrode is disposed in a first trench formed in the semiconductor substrate, wherein a field plate electrode is disposed in a second trench formed in the semiconductor substrate, and wherein the first trench and the second trench are laterally spaced apart from one another.

12. The semiconductor device of claim 11, further comprising:
an additional strain-inducing material embedded in the field plate electrode,
wherein the field plate electrode adjoins a drift region of the semiconductor substrate,
wherein the field plate electrode is under either tensile or compressive stress in the first direction,
wherein the additional strain-inducing material either enhances or at least partly counteracts the stress of the field plate electrode in the first direction.

13. The semiconductor device of claim 1, wherein the electrode structure is a planar gate electrode structure disposed on a first main surface of the semiconductor substrate, wherein the electrode is a gate electrode, and wherein the insulating material separates the gate electrode from the first main surface of the semiconductor substrate.

14. The semiconductor device of claim 13, further comprising:
a trench formed in the semiconductor substrate;
a field plate electrode in the trench and separated from the semiconductor substrate by an additional insulating material.

15. The semiconductor device of claim 14, further comprising:
an additional strain-inducing material embedded in the field plate electrode,
wherein the field plate electrode is under either tensile or compressive stress in the first direction,
wherein the additional strain-inducing material either enhances or at least partly counteracts the stress of the field plate electrode in the first direction.

16. The semiconductor device of claim 1, wherein the electrode is a field plate electrode, wherein the field plate electrode is disposed in a trench formed in the semiconductor substrate, and wherein the region of the semiconductor substrate that adjoins the electrode structure is a drift region.

17. The semiconductor device of claim 16, wherein the semiconductor device is an n-channel device, wherein the charge carriers that contribute to the current flow in the first direction are electrons, and wherein the strain-inducing material either enhances or at least partly counteracts the stress of the field plate electrode in the first direction such that strain in the drift region becomes more tensile or less compressive in the first direction.

18. The semiconductor device of claim 17, wherein the field plate electrode is under tensile stress in the first direction, and wherein the strain-inducing material is either under less tensile stress than the field plate electrode or under compressive stress in the first direction.

19. The semiconductor device of claim 17, wherein the field plate electrode is under compressive stress in the first direction, and wherein the strain-inducing material is under more compressive stress than the field plate electrode in the first direction.

20. The semiconductor device of claim 16, wherein the semiconductor device is a p-channel device, wherein the charge carriers that contribute to the current flow in the first direction are holes, and wherein the strain-inducing material either enhances or at least partly counteracts the stress of the field plate electrode in the first direction such that strain in the drift region becomes more compressive or less tensile in the first direction.

21. The semiconductor device of claim 20, wherein the field plate electrode is under compressive stress in the first direction, and wherein the strain-inducing material is either under less compressive stress than the field plate electrode or under tensile stress in the first direction.

22. The semiconductor device of claim 21, wherein the field plate electrode is under tensile stress in the first direction, and wherein the strain-inducing material is under more tensile stress than the field plate electrode in the first direction.

23. The semiconductor device of claim 16, wherein the trench further includes a gate electrode disposed above the field plate electrode and insulated from the field plate electrode.

24. The semiconductor device of claim 16, wherein a gate electrode is disposed in an additional trench formed in the semiconductor substrate, and wherein the trench and the additional trench are laterally spaced apart from one another.

25. The semiconductor device of claim 1, wherein the semiconductor device is an n-channel device, and wherein the strain-inducing material comprises a material selected from the group consisting of silicon oxide, silicon nitride, a piezoelectric material, and graphenic carbon.

26. The semiconductor device of claim 1, wherein the electrode has a void, wherein the strain inducing material lines sidewalls and a bottom of the void, and wherein the strain-inducing material comprises silicon oxide.

27. The semiconductor device of claim 26, wherein the void in the electrode is filled completely with the silicon oxide.

28. The semiconductor device of claim 26, wherein an inner region of the void spaced inward from the sidewalls and the bottom of the void is unfilled by the silicon oxide.

29. The semiconductor device of claim 1, wherein the semiconductor device is a p-channel device, and wherein the strain-inducing material comprises a material selected from the group consisting of silicon nitride, titanium nitride, tungsten, and a silicide.

30. The semiconductor device of claim 1, wherein the strain-inducing material comprises a piezoelectric material, wherein the electrode structure comprises an additional electrode embedded in the piezoelectric material, and wherein the electrode and the additional electrode are configured to apply an electric field to the piezoelectric material to control the strain of the strain-inducing material.

* * * * *

UNITED STATES PATENT AND TRADEMARK OFFICE
CERTIFICATE OF CORRECTION

PATENT NO. : 11,728,427 B2
APPLICATION NO. : 17/353119
DATED : August 15, 2023
INVENTOR(S) : S. Karner et al.

It is certified that error appears in the above-identified patent and that said Letters Patent is hereby corrected as shown below:

In the Claims

Column 17, Line 15 (Claim 26, Line 2) please change "strain inducing" to -- strain-inducing --

Signed and Sealed this
Twenty-sixth Day of September, 2023

Katherine Kelly Vidal
*Director of the United States Patent and Trademark Office*